United States Patent
Van Der Stam

(10) Patent No.: US 9,786,562 B2
(45) Date of Patent: Oct. 10, 2017

(54) METHOD AND DEVICE FOR CUTTING WAFERS

(71) Applicant: ASM Technology Singapore Pte Ltd, Singapore (SG)

(72) Inventor: Karel Maykel Richard Van Der Stam, Apeldoorn (NL)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 15/095,520

(22) Filed: Apr. 11, 2016

(65) Prior Publication Data

US 2016/0315010 A1    Oct. 27, 2016

(30) Foreign Application Priority Data

Apr. 21, 2015    (EP) .................................... 15001166

(51) Int. Cl.

| | |
|---|---|
| *H01L 21/78* | (2006.01) |
| *H01L 21/82* | (2006.01) |
| *H01L 21/268* | (2006.01) |
| *B23K 26/067* | (2006.01) |
| *B23K 26/082* | (2014.01) |
| *B23K 26/364* | (2014.01) |
| *B23K 26/38* | (2014.01) |
| *B23K 26/0622* | (2014.01) |
| *B23K 101/40* | (2006.01) |

(52) U.S. Cl.
CPC .......... *H01L 21/78* (2013.01); *B23K 26/0622* (2015.10); *B23K 26/0676* (2013.01); *B23K 26/082* (2015.10); *B23K 26/364* (2015.10); *B23K 26/38* (2013.01); *H01L 21/268* (2013.01); *B23K 2201/40* (2013.01)

(58) Field of Classification Search
CPC ............................ H01L 21/78; H01L 21/7813
USPC .................................................. 438/460–465
See application file for complete search history.

(56) References Cited

U.S. PATENT DOCUMENTS

| | | | |
|---|---|---|---|
| 2005/0101108 A1* | 5/2005 | Genda .............. | H01L 21/67092 438/462 |
| 2006/0148210 A1* | 7/2006 | Furuta .............. | B23K 26/0604 438/460 |
| 2015/0108692 A1* | 4/2015 | Harley ............. | H01L 31/02168 264/400 |

* cited by examiner

*Primary Examiner* — Moazzam Hossain
*Assistant Examiner* — Omar Mojaddedi
(74) *Attorney, Agent, or Firm* — Ostrolenk Faber LLP

(57) ABSTRACT

A method is described of radiatively cutting a wafer, the method comprising the steps of low power cutting of two trenches followed by high power cutting of a fissure. A single pulsed radiation beam is split into a first pulsed radiation beam for cutting at least one of the trenches and a second pulsed radiation beam for cutting the fissure. When cutting a fissure on the wafer in a cutting direction along a cutting street, the first and second radiation beams are directed simultaneously with the first radiation beam leading and the second radiation beam trailing. For cutting a fissure in the opposite cutting direction, a third pulsed radiation beam for trenching is split from said single pulsed radiation beam.

12 Claims, 9 Drawing Sheets

METHOD AND DEVICE FOR CUTTING WAFERS

FIELD OF THE INVENTION

The present invention relates in general to the field of semiconductor manufacture.

BACKGROUND OF THE INVENTION

Miniaturization of electronic components has led to various improvements in semiconductor technology to make electronic components ever-smaller. Such components may include simple components such as diodes, up to complex components such as integrated circuits. Apart from electronic components, mechanical components can also be manufactured using the same technology.

In the art of semiconductor technology, it is commonly known that a wafer of semiconductor material, typically silicon, is processed to form the components in a surface area of the wafer. The wafer is macroscopic, having a diameter ranging in the order of 20-300 mm, while the components are microscopic, typically having a size in the micrometer range. Each component is made in a small wafer portion, with the various wafer portions being located at a small distance from each other. After the processing steps, the wafer is cut to separate the various wafer portions from each other, so that the components become available independent from each other. After separation, each separated wafer portion is referred to as a die, and the separation process is known as dicing. The present invention relates particularly to the field of dicing.

The various wafer portions are typically arranged in a square pattern, separated by mutually orthogonal lanes, also indicated as "dicing streets". The separation process involves applying a cut in each dicing street. Evidently, it is desirable that the surface area of the wafer is used as efficiently as possible, therefore said dicing streets are very narrow, which makes the precision requirements for the dicing processing very severe. Further, along the said orthogonal lanes the top layer is an insulating or low-conductivity semiconductor material, which may be relatively brittle, and a traditional blade dicing method will cause severe damage to this top layer.

To overcome these problems, a hybrid dicing process has already been proposed in the prior art. This process is basically a two-step process, including a first step where radiation, typically a high power laser beam, is used to remove the top layer of the dicing streets, and a second step where a blade is used to cut the bulk silicon. The first step is also indicated as "radiative cutting", or more conveniently as "laser cutting". The present invention relates more particularly to a method of laser cutting.

FIG. 1 is a schematic top view of a portion of a wafer 1, showing component portions 3 separated by dicing streets 4. FIG. 2 is a schematic cross section of a portion of the wafer 1, illustrating (on an exaggerated scale) subsequent steps in a laser grooving process. The top layer of the wafer 1 is indicated at reference numeral 2. In a first step of the laser grooving process (see FIG. 1 right-hand side, and FIG. 2 second picture), a relatively low power laser beam 11, 12 is directed to an edge area 13, 14 of a dicing street 4. Arrows indicate the relative movement of the laser beam 11, 12 and dicing street 4 with respect to each other, in a direction parallel to the longitudinal direction of the street 4. This relative movement may be practised by holding the wafer stationary and moving the laser beam, or by holding the laser beam and moving the wafer, or both. In practice, it is more convenient to hold the optical system stationary and move the wafer; nevertheless, the movement will be indicated as a "cutting" or "scribing" movement of the laser beam. Laser power and beam speed are controlled such that the top region of the wafer 1 is removed (ablated) up to a relatively low depth and small width; the resulting elongate recesses at opposite sides of the streets 4 are indicated as "trenches" 15, 16. The depth of the trenches 15, 16 is larger than the thickness of the top layer 2. This first step of the laser grooving process is hereinafter referred to as "cutting" or "scribing" trenches.

In a second step of the laser grooving process (see FIG. 1 left-hand side, and FIG. 2 lower picture), a relatively high power laser beam 21 is directed to a central area 17 of the dicing street 4. The width of this laser beam 21 covers the entire street width between the trenches 15, 16. The resulting elongate central recess in the centre of the street 4 is indicated here as a "furrow" 18. This second step of the laser grooving process is hereinafter referred to as "scribing" a furrow.

The combination of furrow 18 with adjacent trenches 15, 16 will be referred to collectively hereinafter as a groove 20. Depending on the precise process parameters, the individual furrow 18 and trenches 15, 16 may or may not be recognizable in the grooves 20. The overall process of forming a groove 20 will also be indicated as "scribing" a groove.

In practice, the high power laser beam 21 may consist of a matrix of high power laser beams 22, which together effect the material ablation up to the desired depth and width. With such matrix, it is simpler to achieve a desired ablation profile, i.e. a relatively wide furrow with substantially constant depth over a large central part thereof.

SUMMARY OF THE INVENTION

Although the above-described laser cutting method has proven to give results with very good quality, it has a drawback that cutting a single groove involves three cutting actions performed in two subsequent cutting steps, i.e. a first step comprising the two scribing actions of scribing two trenches with two low power beams and a second step comprising the cutting action of cutting a central fissure with one or more high power beams. Further, the first step comprising the two cutting actions of scribing two trenches either requires a very complicated and expensive setup with two lasers, in which case the first step can be performed in one pass of the laser system, or requires two separate cutting steps with a single laser, which however would further reduce the productivity because it would require two subsequent passes of the laser system.

An objective of the present invention is to seek to provide a laser cutting method that is capable of providing the same results as far as quality is concerned, yet with a significantly improved productivity.

According to the present invention, the above objective is attainable by using one single high power parent beam, that is divided into separate divisional beams for simultaneously performing at least two cutting actions in one pass of the laser system. Especially, the two cutting actions of cutting two trenches are performed in one pass of the laser system, but highest efficiency is achieved when the three cutting actions of cutting the two trenches and the fissure are performed in one pass of the laser system.

BRIEF DESCRIPTION OF THE DRAWINGS

These and other aspects, features and advantages of the present invention will be further explained by the following description of one or more preferred embodiments with reference to the drawings, in which same reference numerals indicate same or similar parts, and in which.

DETAILED DESCRIPTION OF THE INVENTION

For convenience, the term "cut" is hereinafter used generically to include scribing (cutting that does not penetrate the full depth of a target work piece) and dicing (cutting through the depth of the target work piece). Moreover, the term "fissure" is hereinafter used generically to include different types of cuts such as a groove formed by scribing or a full cut formed by dicing a target work piece.

An aspect of the present invention involves a controllable beam deflector. A controllable beam deflector is a device capable of changing the direction of an optical beam and of precisely controlling its deflection angle, typically within a certain deflection range. Controllable beam deflectors are known per se, for instance from U.S. Pat. No. 4,028,636, therefore a description and explanation will be kept brief.

Figure 1:
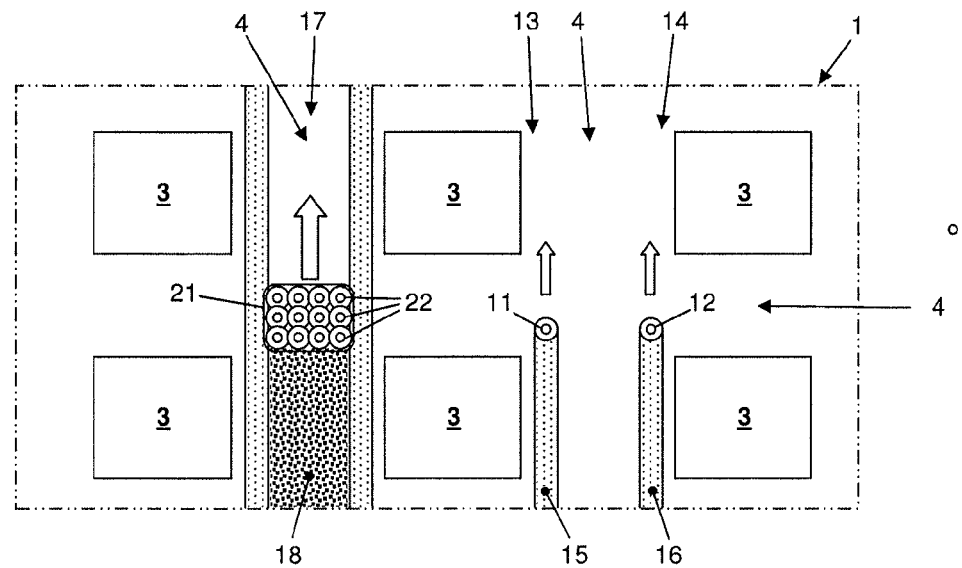
FIG. 1 schematically shows a top view of a portion of a wafer.
Figure 2:
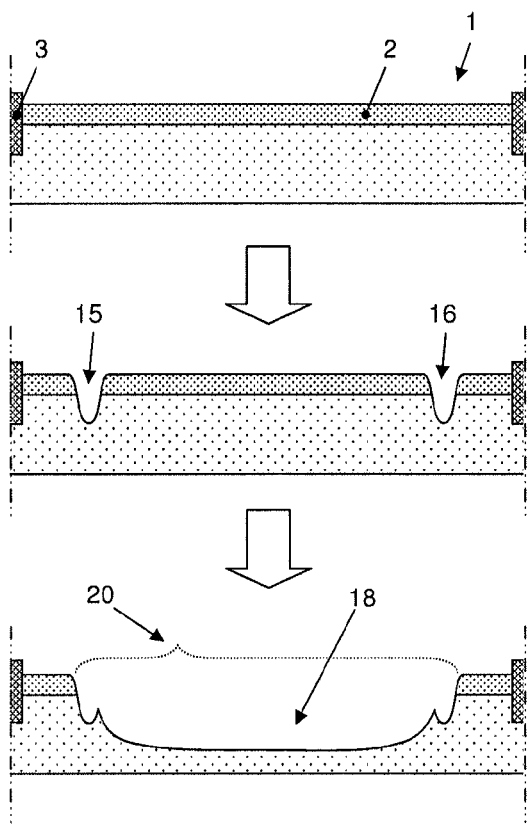
FIG. 2 is a schematic cross section of a portion of the wafer.
Figure 3:
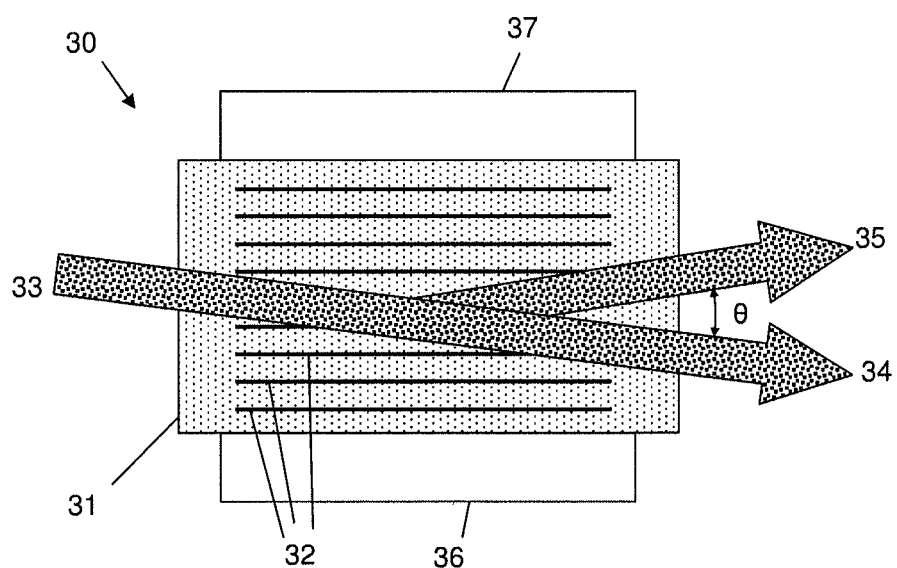
FIG. 3 schematically shows the setup and operation of an acousto-optical deflector.

FIG. 3 schematically shows the setup and operation of an acousto-optical deflector 30, hereinafter abbreviated as AOD. The AOD 30 comprises an optical crystal 31 that includes mutually parallel layers 32 having mutually different optical indexes. The layers, here shown in horizontal orientation, behave as a Bragg grating. Reference numeral 33 indicates an incident laser beam, incident on the optical layers under a relatively small angle of incidence. Reference numeral 34 indicates that part of the laser beam passes the crystal in line with the incoming direction, while reference numeral 35 indicates that part of the laser beam will be deflected under a small angle with respect to the incoming direction. The beams 33, 34, 35 are located in a common virtual plane perpendicular to the layers 32, indicated as deflection plane. The optical power will be transmitted to the deflected beam 35, which will also be indicated as "output beam". The precise value of the angle of deflection depends on the actual wavelength of the laser beam and on the mutual distance between the Bragg layers 32 (hereinafter indicated as "grating parameter"), and hence is an apparatus characteristic.

The angle of deflection can be controlled by controlling the laser wavelength and/or by controlling the grating parameter. The grating parameter can be controlled by subjecting the crystal 31 to mechanical stress. Reference numeral 36 indicates an acoustic transducer for applying an acoustic wave to the crystal 31, having a wave propagation direction substantially perpendicular to the laser beam direction. Reference numeral 37 indicates an absorber for absorbing the acoustic energy to prevent reflections. The propagating acoustic waves cause density variations in the crystal 31, which in turn leads to refractive index variations in the crystal 31 in a direction parallel to the wave propagation direction. It can be shown that, in first approximation, the angle of deflection of the output laser beam 35 is proportional to the acoustic frequency. It is noted that the wavelength of the output laser beam 35 also depends on the acoustic frequency, but this has no consequence for the ablation process. It is further noted that the relative intensity of the deflected beam 35 depends on the RF power, i.e. higher RF power gives more laser light in the deflected beam.

Figure 4:
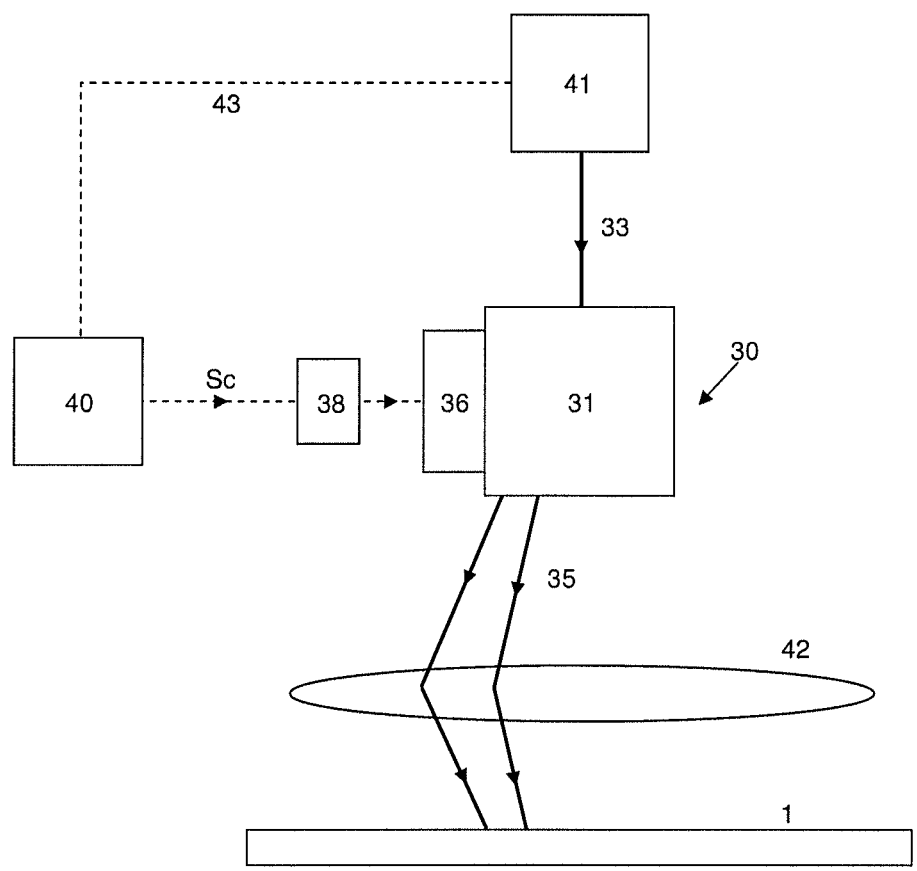
FIG. 4 is a schematic diagram showing the use of an acousto-optical deflector in accordance with the present invention.

In the following, the acoustic frequency Fa will be considered as a control parameter of the ablation process. FIG. 4 is a schematic diagram showing a setup in accordance with the present invention, showing an AOD 30 as discussed above arranged above the wafer 1. An optical system for directing the output deflected laser beam 35 to the wafer 1 is generally indicated at reference numeral 42. Reference numeral 38 indicates an acoustic driver for driving the transducer 36, and reference numeral 40 indicates a control device for controlling the acoustic driver 38 such as to set the acoustic frequency Fa of the acoustic driver. A control signal is indicated as Sc. The figure further schematically shows a laser source 41 for providing the laser beam 33. More particularly, the laser beam 33 is provided as a series of laser pulses having a repetition frequency FP. Reference numeral 43 indicates a communication path between the laser source 41 and the control device 40. It may be that the control device 40 provides a control signal for the laser source 41 such as to control the timing of the laser pulses, or it may be that the laser source 41 provides a timing signal to the control device 40 such as to inform the control device 40 of the timing of the laser pulses; in any case, the control device 40 knows the timing (i.e. frequency and phase) of the laser pulses.

An aspect of the invention involves the use of a controllable beam deflection device, such as for instance an AOD, in the process of cutting a trench, such as to cut both trenches in a single pass.

Figure 5:
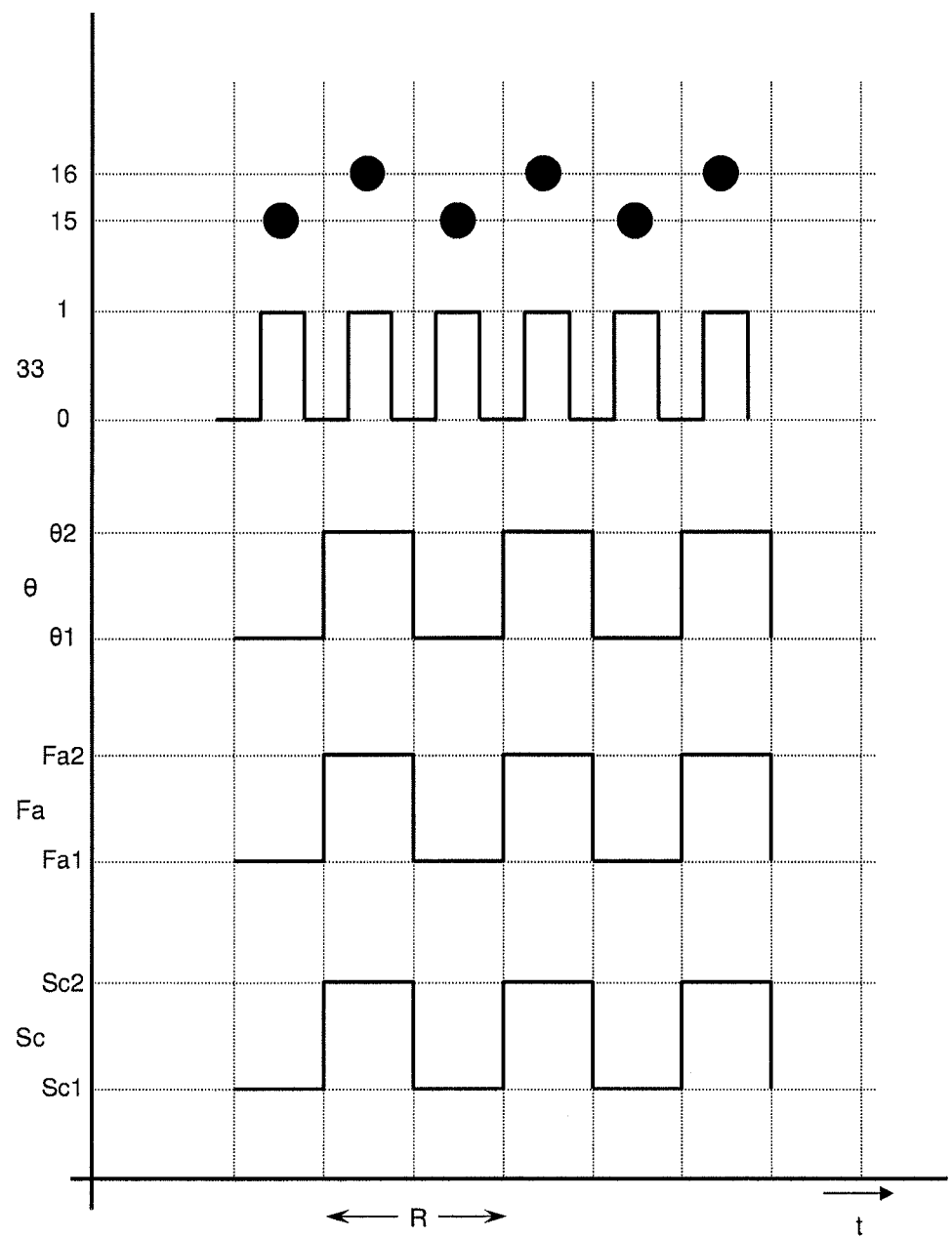
FIG. 5 is a chart schematically illustrating the control of an acousto-optical deflector for the process of cutting two trenches.

FIG. 5 is a chart schematically illustrating the control of the acoustic driver 38 for performing cutting actions to scribe the trenches 15 and 16. The horizontal axis represents time. The lowest graph represents the control signal Sc as a function of time. The control signal Sc is shown as a block signal switching between two values indicated as Sc1 and Sc2. The switching has a repetition period R and a switching frequency indicated as FS=1/R. Although a square signal with 50/50 duty cycle is ideal, this is not absolutely essential.

The second graph from the bottom shows the resulting acoustic frequency Fa as a function of time. It can be seen that the acoustic frequency Fa switches between two values indicated as Fa1 and Fa2, in correspondence with the control signal Sc switching between Sc1 and Sc2.

The third graph from the bottom shows the resulting beam deflection angle θ as a function of time. It can be seen that the beam deflection angle θ switches between two values indicated as θ1 and θ2, in correspondence with the control signal Sc switching between Sc1 and Sc2.

The fourth graph from the bottom illustrates the timing of the laser pulses 33. This curve is shown as a digital block signal, with "1" indicating laser power and "0" indicating interpulse spacing. It can be seen that the laser pulses are synchronized with the control signal Sc, always occurring when the beam deflection angle θ has adopted either value Sc1 or Sc2. It follows that the pulse repetition frequency FP=2·FS.

Figure 6:
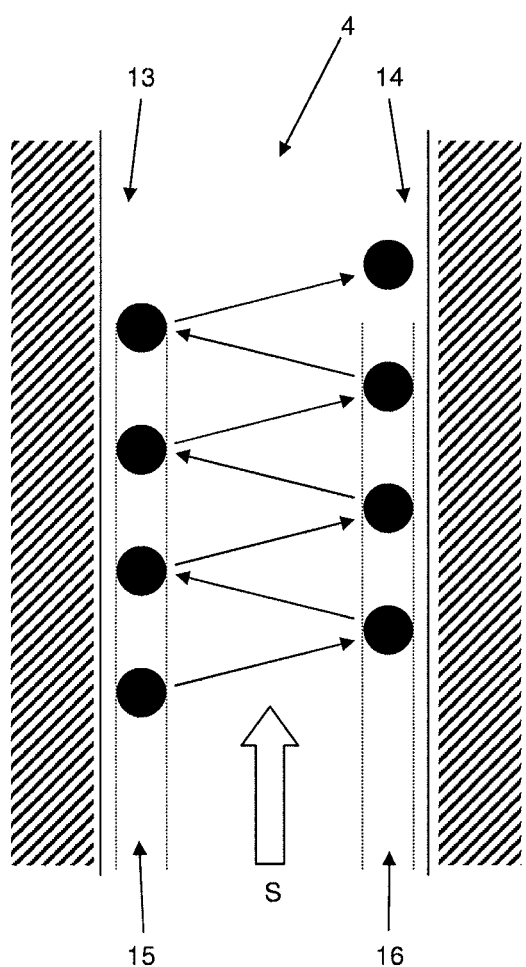
FIG. 6 is a schematic top view of a cutting street of a wafer, showing the consecutive laser spots in the process of cutting two trenches in accordance with the present invention.

FIG. 6 is a schematic top view of a cutting street or dicing street 4 of a wafer 1. The system of FIG. 4 is arranged over this dicing street 4, and a cutting movement is performed in the direction of this dicing street, indicated by an arrow S. The AOD 30 is arranged such that the deflection direction is substantially transverse to the cutting or scribing direction, preferably about 90° to the scribing direction. Black dots indicate the spots where the deflected laser pulses 35 hit the target, while arrows between these dots show the sequence of the laser spots. It can be seen that, whenever the deflection angle θ has a first value θ1, the laser spots are located at one side of the street 4, while the laser spots are located at the opposite side of the street 4 whenever the deflection angle θ has the second value θ2. This information is also illustrated in the upper graph of FIG. 5, in which the respective spots per trench are shown aligned with the timing of the laser pulses 33. The cutting speed is selected in conjunction with the spot diameter such that the spots overlap and form the respective trenches 15 and 16; in FIG. 6, for sake of clarity, the respective spots are shown with spacing in between.

It is important to realize that the laser beam 33 is not a continuous beam but a pulsed beam. When the beam is held in a fixed orientation, i.e. constant θ, the cutting movement will cause a straight series of aligned ablation spots. Another way of describing the process of cutting a trench is that the laser beam 33 is divided into two sub-beams each having a fixed direction defined by the respective deflection angle θ1, θ2, and each having a reduced pulse repetition frequency FPr equal to half the pulse repetition frequency FP of the original laser beam 33, these two beams pulsing in an interlaced manner. Each individual sub-beam can be considered as a "normal" beam having a fixed orientation θ1, θ2, and thus cutting a corresponding straight series of aligned ablation spots to form a fissure such as a trench. For the purpose of discussion, the frequency of consecutive ablation spots in the cutting or scribing direction will also be indicated as cutting or scribing frequency Fscr.

In an example, FP=300 kHz and FS=150 kHz. The cutting speed is 375 mm/s. Thus, for each trench the ablation spots are made at a pitch of 2.5 μm. The laser pulses have a duration of 0.2 μs and energy equivalent to 5 μJ. Ablation spots having diameters of about 6 μm are used.

Figure 7:
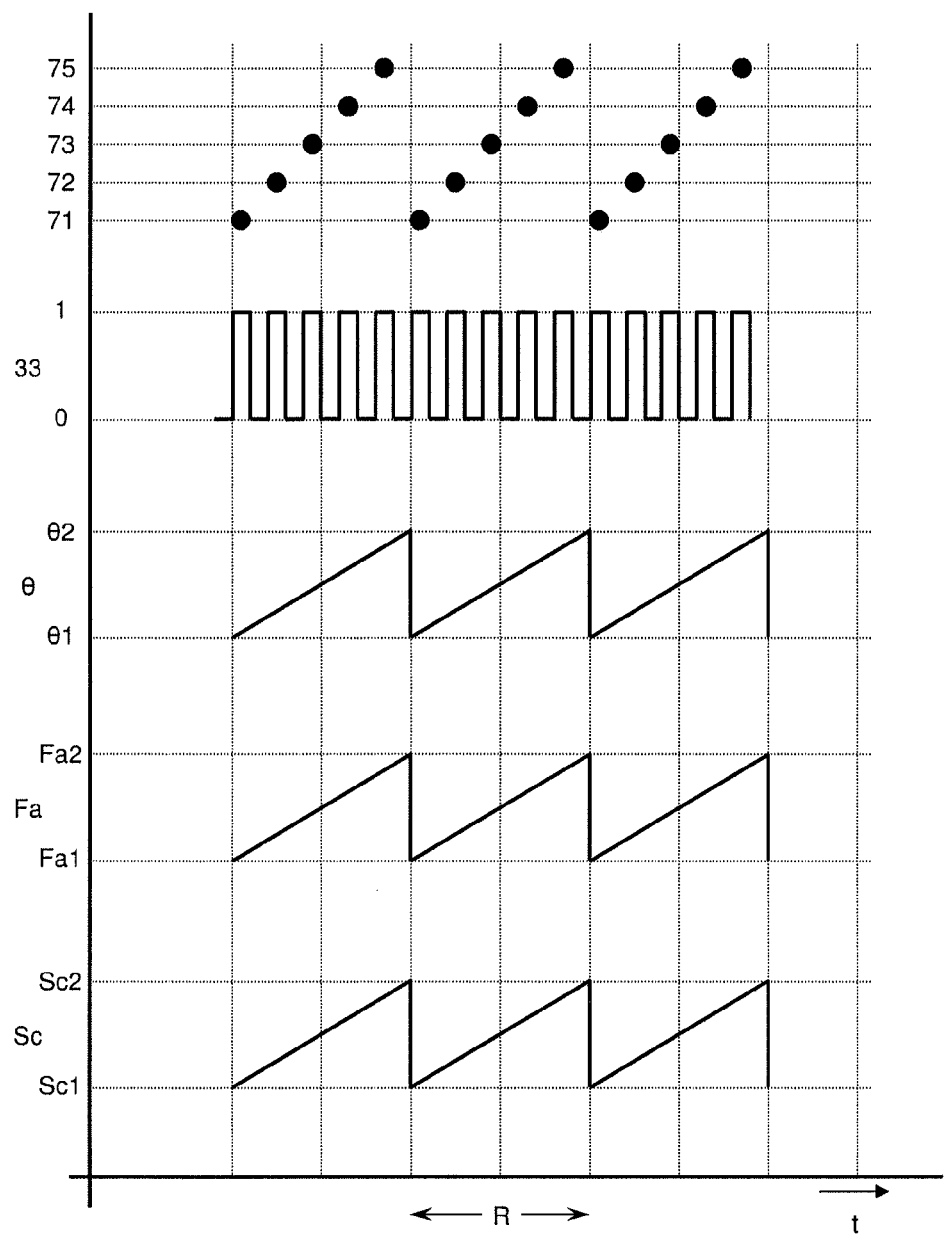
FIG. 7 is a chart schematically illustrating the control of an acousto-optical deflector for the process of cutting a fissure.

An aspect of the invention involves the use of a controllable beam deflection device, such as for instance an AOD, in the process of scribing the furrow. In a similar manner as described above in the context of scribing a trench, a single beam is scanned over the width of the dicing streets, or, in other words, a single beam is divided into a plurality of sub-beams each having a fixed direction defined by the respective deflection angles, each scribing a respective one of neighbouring sections of a furrow. This principle will be explained with reference to FIGS. 7 and 8, which compare to FIGS. 5 and 6, respectively. The setup for laser pulse generation and deflection can be considered identical to the setup of FIG. 4, so description and explanation will not be repeated here.

In FIG. 7, the bottom graph again represents the control signal Sc as a function of time. In this case, the control signal Sc is a sawtooth signal gradually changing from a first value Sc1 to a second value Sc2 and then quickly returning to the first value. The switching has a repetition period R and a switching frequency indicated as FS=1/R. Instead of a constantly rising sawtooth, the sawtooth may also be stepped.

The second graph from the bottom shows the resulting acoustic frequency Fa as a function of time. It can be seen that the acoustic frequency Fa has a sawtooth shape between two values indicated as Fa1 and Fa2, in correspondence with the control signal Sc switching between Sc1 and Sc2.

The third graph from the bottom shows the resulting beam deflection angle θ as a function of time. It can be seen that the beam deflection angle θ has a sawtooth shape between two values indicated as θ1 and θ2, in correspondence with the control signal Sc switching between Sc1 and Sc2.

The fourth graph from the bottom illustrates the timing of the laser pulses 33. This curve is shown as a digital block signal, with "1" indicating laser power and "0" indicating interpulse spacing. It can be seen that the laser pulses are synchronized with the control signal Sc, such that the pulse repetition frequency FP is an integer multiple of the switching frequency FS. In the example shown, FP=5·FS. It should be appreciated that the sawtooth shape is only one example for attaining a flat grooving base. Different shapes of control signals may be preferable for achieving other fissure or groove shapes.

Figure 8:
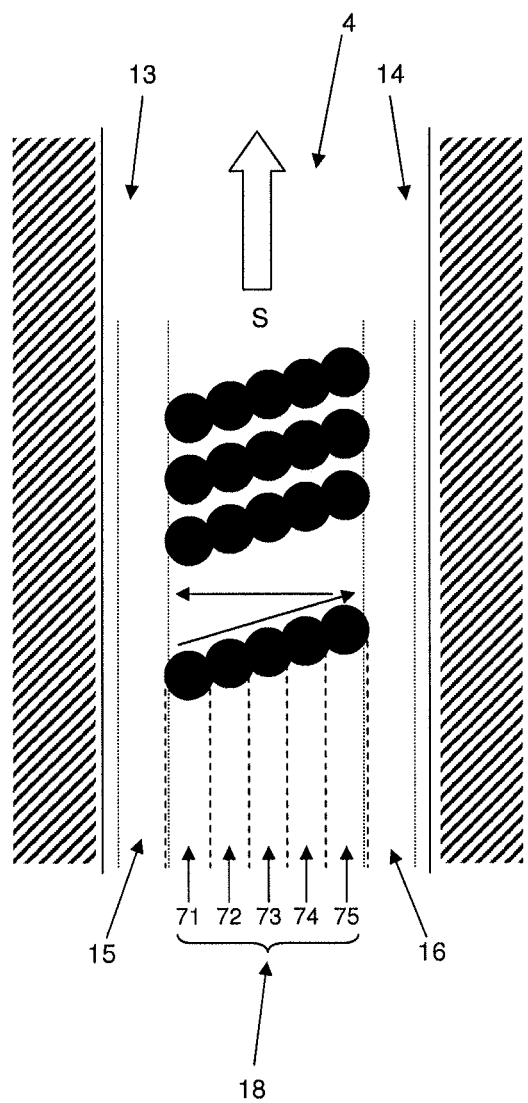
FIG. 8 is a schematic top view of a cutting street of a wafer, showing the consecutive laser spots in the process of cutting two trenches in accordance with the present invention.

In FIG. 8, black dots again indicate the spots where the deflected laser pulses 35 hit the target, while arrows show the sequence of the laser spots. It can be seen that, with the steady increase of the deflection angle θ, the laser spots shift from a first extreme tangential position 71 via intermediate positions 72, 73, 74 to a second extreme tangential position 75, after which the next laser spot is again at the first extreme tangential position 71. This information is also illustrated in the upper graph of FIG. 7, in which the respective spots 71-75 are shown aligned with the timing of the laser pulses 33. In this case, for cutting the furrow 18, use is made of a laser beam 33 of higher power than the one discussed for cutting the trenches 15, 16, which are shown in FIG. 8 because the cutting of the furrow 18 takes place after cutting the trenches 15, 16. It should be clear that the laser power and the laser pulse duration, which lead to a certain spot diameter, and the laser pulse frequency are selected in conjunction with each other and with the width of the furrow to be formed, such that the laser spots overlap in the width direction of the furrow 18, as shown. The same applies to the cutting direction, but for sake of clarity, the respective spots are shown with spacing in between in the cutting direction.

Figure 9:
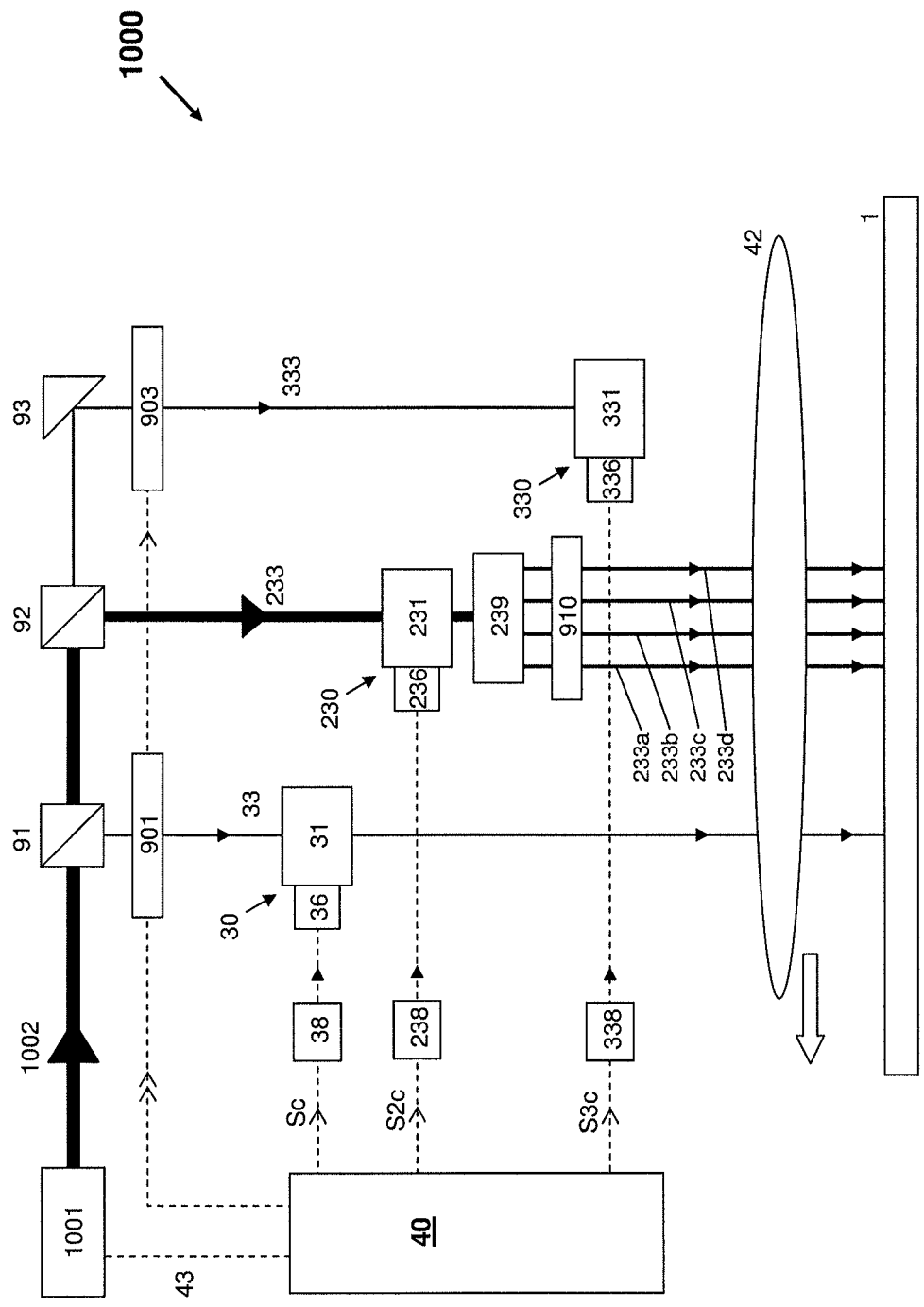
FIG. 9 is a diagram schematically illustrating an example of a cutting apparatus according to the present invention.

FIG. 9 is a diagram schematically illustrating a preferred cutting apparatus 1000 according to the present invention. The cutting apparatus 1000 comprises a receiving chuck for receiving and holding a wafer, but the receiving chuck is not shown for the sake of simplicity. The cutting apparatus 1000 comprises a single pulsed laser 1001 for generating the pulsed beams for cutting trenches and for cutting fissures as described above. A high power pulsed laser beam 1002 as generated by the laser 1001 meets a first beam splitter 91, a second beam splitter 92 and a mirror 93.

Other optical geometries for generating the three beams 33, 233, 333 are also possible. In the geometry shown, a relative small first portion 33 is split out from the high power pulsed laser beam 1002 by the first beam splitter 91 to produce a first laser beam 33 for cutting trenches, as discussed above. The largest part of the laser pulse 1002 passes the first beam splitter 91 to meet the second beam splitter 92. The second beam splitter 92 splits out a relatively large second portion 233, while a relatively small third portion 333 passes the second beam splitter 92 and is reflected down by a reflector 93.

The first laser pulse portion 33 meets a first AOD 30, controlled by a first control signal Sc from the control device 40, to cut both trenches 15, 16 in an interleaved manner, as explained with reference to FIGS. 4, 5, 6. The apparatus 1000 comprises a displacement device for displacing the optics and the wafer with respect to each other, but such displacement device is not shown for sake of simplicity. While in practice the optics will be stationary while the wafer 1 will be moving, for the present discussion the wafer 1 will be considered as a stationary reference and the laser system will be described as moving with respect to the wafer 1 in the cutting direction, which is from the right to the left in the drawing of FIG. 9. The second laser pulse portion 233 is located behind the first laser pulse portion 33 with a view to the cutting direction, i.e. it hits the street 4 after the first laser pulse portion 33 has passed. The second laser pulse portion 233 meets a second AOD 230, comprising a second crystal 231 and having a second acoustic transducer 236 driven by a second driver 238 controlled by a second control signal S2c from the control device 40, to cut the fissure or furrow 18, as explained with reference to FIGS. 4, 7, 8.

The apparatus as described so far, i.e. with the two optical paths for the two optical beams 33 and 233, already provides advantages in the sense of cutting trenches and a fissure in one single pass. Thus, a simplified embodiment of the apparatus shown in FIG. 9 could do without the third beam 333 and corresponding optics, and the second beam splitter 92 would be replaced by a mirror such as 93. However, such apparatus would only have one operational direction. After having made the fissure or groove 20 in one street 4, a fissure or groove has to be made in the neighbouring street, in which case the first beam 33 for cutting a trench would have to be the leading beam again. This would require that the optical arrangement be mechanically reversed, which would require complicated and accurate mechanics, or that the apparatus would make an idle stroke back to the beginning of the next street such as to perform the cutting or grooving action in the same operational direction. In the embodiment of FIG. 9, these complications are avoided. The apparatus has two operational modes: In one operational mode, a groove is scribed in one cutting direction (i.e. from the right to the left in FIG. 9) wherein the first beam 33 and the second beam 233 are operational, as described in the above. In a second operational mode, a groove is scribed in the opposite cutting direction (i.e. from the left to the right in FIG. 9) wherein the third beam 333 and the second beam 233 are operational. In each of said modes, the second beam 233 would be trailing. Operation and control of the third beam 333 is identical to the operation and control of the first beam 33, and the description and explanation is not repeated here.

Consequently, in the first operational mode, the third beam 333 is inoperative, while in the second operational mode the first beam 33 is inoperative. For this purpose, the apparatus 1000 comprises a first switchable beam absorber 901 arranged in the optical path between the first beam splitter 91 and the wafer 1, and a second switchable beam absorber 903 arranged in the optical path between the mirror 93 and the wafer 1. Said switchable beam absorbers are controlled by the control device 40. In the first operational mode, the first switchable beam absorber 901 is in a passing condition and the second switchable beam absorber 903 is in an absorbing condition. In the second operational mode, the second switchable beam absorber 903 is in a passing condition and the first switchable beam absorber 901 is in an absorbing condition. Alternatively, instead of incorporating beam absorbers 901, 903, the AOD 30, 231 may deactivate the beams by deflecting the beams away from the target to a predetermined region that is benign to cutting when the beams are not in use for cutting.

In the apparatus as described so far, each portion of the furrow 18 would be effected in one single ablation step, i.e. by one single laser pulse. While this is possible in principle, it does require very high heat input in one single ablation spot, which may lead to quality problems in the remaining wafer. In order to avoid these problems, it is preferred that each furrow portion is ablated in multiple ablation steps of reduced laser power and hence reduced heat input per step. The present invention also provides an embodiment capable of effecting this in one single pass, illustrated in FIG. 9. In this embodiment, a beam splitting device 239, for instance a diffractive optical element, is arranged in the optical path between the second beam splitter 92 and the wafer 1, to split the high power beam 233 into multiple sub-beams of reduced power. The figure shows a splitting into four sub-beams 233a, 233b, 233c, 233d, thus each sub-beam 233a, 233b, 233c, 233d would have a laser power of 25% of the power of beam 233, but the number of sub-beams may be two, three, or five or more. The splitting direction of the beam splitting device 239 is substantially parallel to the cutting direction and/or substantially perpendicular to the deflection direction of the second AOD 230. Consequently, while the sub-beams 233a, 233b, 233c, 233d are of course operative simultaneously and have mutually the same deflection angle, their corresponding spots move over the street 4 behind each other in the cutting direction.

While the high power second beam 233 is responsible for the overall process of cutting a furrow, the individual sub-beams 233a, 233b, 233c, 233d each are responsible for ablating subsequent layers from the wafer material.

The laser 1001 has a pulse repetition frequency FP: consecutive laser pulses are produced at the frequency FP. However, for a certain transverse position in the street 4, corresponding to a certain value of the deflection angle, consecutive laser pulses follow each other in the cutting direction at the cutting or scribing frequency Fscr equal to the acoustic frequency Fa of the corresponding AOD. In the above, with reference to FIGS. 5 and 6, this has been explained for the process of cutting a trench, but the same applies of course to the process of cutting a furrow. Since in the process of cutting a furrow the laser pulses are produced at the same frequency FP, with reference to FIGS. 7 and 8 it should be clear that the acoustic frequency of the second AOD 230 differs from the acoustic frequency of the first AOD 30. Particularly, for the acoustic frequency Fa of a certain AOD the following formula applies:

$$Fa = FP/N$$

wherein N is an integer equal to the number of beam positions in a substantially transverse direction of the street 4 for that particular beam. It can be seen that for the process of cutting a trench, this number (indicated as Nt) is equal to 2, while in the process of cutting a furrow this number (indicated as Nf) is equal to 5 in the example shown. In any case, Nf is larger than Nt. Since, obviously, the cutting speed is the same for the respective processes of cutting trenches and furrows, it follows that the mutual distance between consecutive ablation spots in the cutting direction is larger in the process of cutting a furrow as compared to the process of cutting a trench. If necessary, in order to assure that consecutive ablation spots in the cutting direction overlap each other sufficiently, a defocusing optical element 910 may be arranged in the optical path between the second AOD 230 and the wafer 1. This defocusing optical element 910 may be asymmetrical, so that the original circular beam contour results in an elliptical spot contour having the longest dimension in the cutting direction.

FIG. 8 illustrates that, if the deflection plane is substantially perpendicular to the cutting direction, the consecutive ablation spots are formed in a straight line that makes an angle smaller than 90° with the cutting direction. If desired, by slightly adjusting the orientation of the crystal 231 in the second AOD 230, this angle can be made equal to 90°.

Figure 10A:
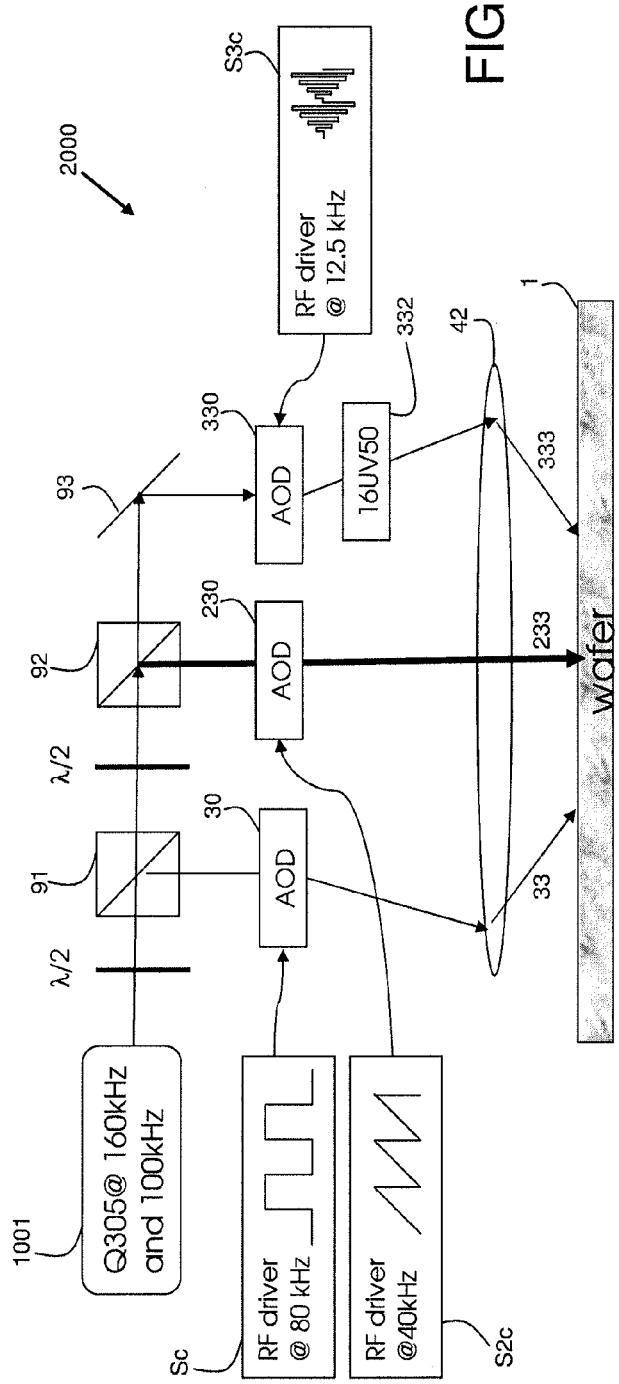
FIG. 10, which includes FIGS. 10a and 10b, schematically illustrates a second example of a cutting apparatus according to the present invention.
Figure 10B:
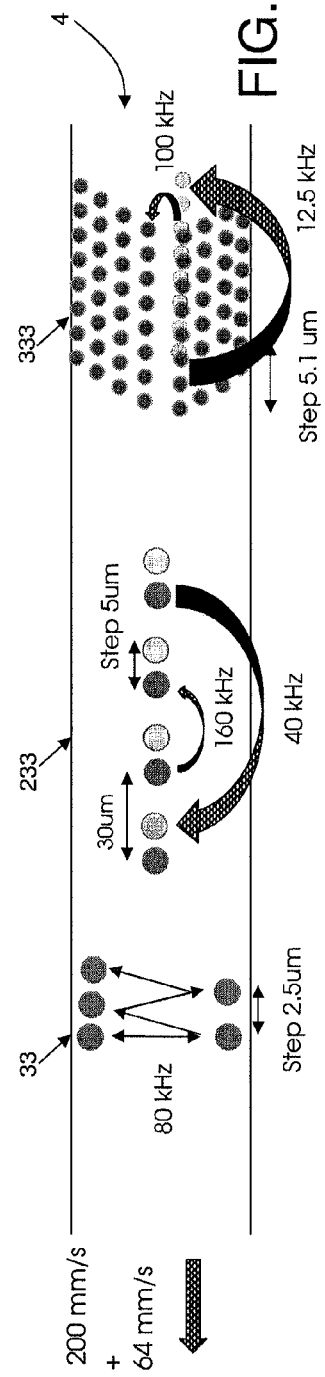

FIG. 10, which includes FIGS. 10a and 10b, schematically illustrates a second preferred cutting apparatus 2000 according to the present invention. The cutting apparatus 2000 similarly comprises a single pulsed laser 1001 for generating the pulsed beams for cutting fissures, such as a full cut through the wafer 1 as a result of dicing. Additionally, post-treatment to remove recast material that is formed during dicing to enhance the die strength of the singulated dice is also achievable using this embodiment of the cutting apparatus 2000. If the available laser power is sufficient, the complete process of trenching, dicing and post treatment can be combined in a single cutting pass.

A high power pulsed laser beam generated by the laser 1001 meets a first beam splitter 91, a second beam splitter 92 and a mirror 93. A portion of the laser beam is split out from the first beam splitter 91 to produce a first laser pulse portion 33 for cutting trenches, as discussed above. A portion of the laser beam passes the first beam splitter 91 to meet the second beam splitter 92. The second beam splitter 92 splits out a relatively larger second laser pulse portion 233, while a remainder of the laser beam passes the second beam splitter 92 and is reflected by a reflector 93 to form a third laser pulse portion 333.

The cutting direction is from the right to the left in the drawing of FIG. 10. The first laser pulse portion 33 meets a first AOD 30, controlled by a first control signal Sc from the control device 40, to cut both trenches 15, 16 in an interleaved manner. The first control signal Sc may comprise an RF driver operating at 80 kHz. The second laser pulse portion 233 is located behind the first laser pulse portion 33 in the cutting direction, i.e. it hits the street 4 after the first laser pulse portion 33 has passed. The second laser pulse portion 233 meets a second AOD 230, which may be driven by a second control signal S2c comprising an RF driver operating at 40 kHz in order to dice the fissure. It should be noted that in relation to the dicing process, the second AOD 230 is arranged such that its scan angle is parallel to the dicing street such that a multiple beam dicing laser is virtually created.

The third laser pulse portion 333 is located behind the second laser pulse portion 233 in the cutting direction. The third laser pulse portion 333 may be driven by a third control signal S3c comprising an RF driver operating at 12.5 kHz. In relation to the post-treatment process, a scan angle of the third AOD 330 is arranged to be substantially transverse to the street 4 (as for the trenching process) and the post-treatment process is alternatively applied to the left and right sides of a dicing kerf. Furthermore, the third laser pulse portion 333 is deflected parallel to the street 4 using a fourth AOD 332 such that the combination virtually creates a plurality of laser beam spots both along a length as well as a width of the cutting street 4.

FIG. 10b illustrates plan views of the respective first, second and third laser pulse portions 33, 233, 333 as distributed by the various AODs 30, 230, 330, 332 in use. It should be appreciated that the dimensions of the illustrations are not according to scale.

In particular, the first laser pulse portion 33 comprises deflected laser pulses to cut the trenches on both sides of the street 4, the laser pulses forming steps having a pitch of 2.5 μm in the direction of the street. The second laser pulse portion 33 is illustrated as being deflected parallel to the street 4, with a deflection pitch of 30 μm in the direction of the street 4.

In respect of the third laser pulse portion 333, four laser beams are located on each side of the street 4 for post-treatment, although the exact configuration is adjustable according to need. Also, the relative power is adjustable by changing the RF power that is input to the third and fourth AODs 330, 332. The laser pulses form steps having a pitch of 5.1 μm in the direction of the street 4. It would be appreciated that the aforesaid approach enables one to combine the three process steps of trenching, dicing and post-treatment into a single cutting pass. This provides greater operational flexibility which was not previously available in the prior art.

Moreover, when the machine configuration is set up in such a way that the second AOD 230 is capable of controllably scanning the second laser pulse portion 233 in two directions, i.e. both substantially parallel and substantially transverse to the street 4, the same cutting apparatus 2000 may be used for both grooving and dicing. A two-dimensional AOD which receives separate RF control signal inputs in two dimensions for scanning in orthogonal directions consecutively would be suitable for implementing such a concept.

This concept is not only applicable for full dicing where the semiconductor wafer is divided into individual components, but it can also be used in laser cutting processes where the wafer's die-strength is weak, such as the cutting of solar cell panels for edge isolation. The aforesaid preferred embodiment results in significant throughput improvement and full flexibility of the process without sacrificing throughput.

For the dicing step, the second AOD 230 is used with a scanning direction which is substantially parallel to the cutting street 4. Depending on the ratio between the envelope of the RF frequency and the laser frequency, the number of pulses can be set. After one RF cycle is completed, the laser beam returns to the original position, and due to the fact that the wafer 1 has moved, the next sequence of pulses hits the wafer at slightly different positions. If the combination of wafer speed, absolute RF frequency and the envelope of the RF frequency are set correctly, the laser cutting process can be performed without the need for high pulse energies.

By using the second AOD 230 to scan the second laser pulse portion 233 substantially parallel to the dicing street, a beam pattern is formed which can generate lower pulse energy at a higher frequency, so that there is no longer a need to adopt a pulsed laser 1001 with very high pulse energy. This brings the requirements for trenching and laser dicing much closer to each other and allows the possibility of operating both process steps with a single common laser cutting apparatus 1000, 2000 with good quality and at fast process speeds.

The first step in the cutting process, namely trenching, can be performed in several possible ways. Both trenches can be generated with a single laser beam in a two-pass process or the two passes can be combined in a single pass by using a splitting device in the form of a DOE to generate two or more beams. A third option would be to apply an AOD to create two trenches in a single pass as described above. In all three cases the laser frequency used should preferably be high to achieve longer laser pulses and better edge quality for the fissure.

It should be clear to a person skilled in the art that the present invention is not limited to the exemplary embodiments discussed above, but that several variations and modifications are possible within the protective scope of the invention as defined in the appending claims.

For instance, instead of a laser, other radiation sources can be used. Further, instead of an absorber 901, 903, a controllable interrupter or shutter can be used.

Further, instead of using a single beam 33 that is effectively split in two beams of temporally interleaved pulses for cutting two trenches in parallel at half the laser pulse frequency per trench, it is possible to use two beam splitters to split out two beams of simultaneous pulses for cutting two trenches in parallel at the laser pulse frequency; the use of the AOD 30 can then be omitted.

Even if certain features are recited in different dependent claims, the present invention also relates to an embodiment comprising these features in common.

Any reference signs in a claim should not be construed as limiting the scope of that claim.

The invention claimed is:

1. Method of radiatively cutting a wafer, the method comprising two cutting actions of low power cutting of two trenches followed by a high power cutting of a fissure between the two trenches, wherein a single pulsed radiation beam is split into at least a first and a second pulsed radiation beams for performing at least two of said cutting actions simultaneously in one pass,
   wherein the fissure is to be cut on the wafer in a cutting direction along a cutting street, wherein the first pulsed radiation beam is for cutting the said two trenches and the second pulsed radiation beam is for cutting the fissure, and wherein the first and second radiation beams are directed simultaneously with the first radiation beam leading and the second radiation beam trailing.

2. Method according to claim 1, wherein in synchronisation with the single pulsed radiation beam the first radiation beam is repetitively deflected in a deflection direction that is substantially transverse to the cutting direction, to intermittently cut two trenches at opposite sides of the cutting street in an interlaced manner.

3. Method according to claim 2, wherein the first radiation beam is deflected at a first deflection frequency equal to half the pulse repetition frequency (FP) of the single pulsed radiation beam.

4. Method according to claim 2, wherein the deflection of the first radiation beam is repetitively switched between a first deflection angle (θ1) and a second deflection angle (θ2).

5. Method according to claim 1, wherein in synchronisation with the single pulsed radiation beam the second radiation beam is repetitively deflected in a deflection direction that is substantially transverse to the cutting direction, to intermittently scan the width of the fissure between the two trenches formed by the first radiation beam.

6. Method according to claim 5, wherein the second radiation beam is deflected at a second deflection frequency equal to the pulse repetition frequency (FP) of the single pulsed radiation beam divided by an integer (N), wherein said integer (N) is equal to 2 or higher.

7. Method according to claim 1, wherein the single pulsed radiation beam is split into said first pulsed radiation beam for cutting the said two trenches, said second pulsed radiation beam for cutting the said fissure, and a third pulsed radiation beam for cutting trenches.

8. Method according to claim 7, the method comprising the steps of:
   in a first operational mode, cutting the said fissure on the wafer in a first cutting direction along a cutting street, wherein the third radiation beam is inoperative, the first radiation beam is directed to cutting said two trenches and the second radiation beam is directed to cutting the said fissure simultaneously with the first radiation beam leading and the second radiation beam trailing; and
   in a second operational mode, cutting a second fissure on the wafer in a second cutting direction opposite the first cutting direction along another cutting street, the second fissure being between two additional trenches, wherein the first radiation beam is inoperative and the third radiation beam is directed to cutting the two additional trenches and the second radiation beam is directed to the second fissure simultaneously with the third radiation beam leading and the second radiation beam trailing.

9. Method according to claim 1, wherein the single pulsed radiation beam is split into said first pulsed radiation beam for cutting the said two trenches, said second pulsed radiation beam for cutting the said fissure, and a third pulsed radiation beam for post-treatment to remove recast material that is formed during cutting of the said fissure.

10. Method according to claim 9, wherein the third pulsed radiation beam is deflected in directions that are substantially transverse to a cutting direction along a cutting street.

11. Method according to claim 1, wherein the fissure is to be cut on the wafer in a cutting direction along a cutting street, wherein at least one of the pulsed radiation beams is configured to be controllably deflectable in either a direction that is substantially parallel to the cutting direction or a direction that is substantially transverse to the cutting direction.

12. Method according to claim 11, wherein the at least one of the pulsed radiation beams is deflected by two-dimensional control signals for controllably deflecting the said pulsed radiation beam consecutively in orthogonal directions.

* * * * *